United States Patent
Obata et al.

(10) Patent No.: US 8,751,895 B2
(45) Date of Patent: Jun. 10, 2014

(54) SEMICONDUCTOR MEMORY DEVICE AND DECODING METHOD

(75) Inventors: Haruka Obata, Tokyo (JP); Tatsuyuki Ishikawa, Kanagawa (JP); Hironori Uchikawa, Kanagawa (JP); Kenji Sakurada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 13/569,492

(22) Filed: Aug. 8, 2012

(65) Prior Publication Data
US 2013/0111292 A1 May 2, 2013

(30) Foreign Application Priority Data
Nov. 1, 2011 (JP) ................ 2011-240483

(51) Int. Cl.
*H03M 13/00* (2006.01)
(52) U.S. Cl.
USPC ......... 714/755; 714/794; 714/786; 375/341; 375/262
(58) Field of Classification Search
None
See application file for complete search history.

(56) References Cited

U.S. PATENT DOCUMENTS

| 8,086,932 | B2 | 12/2011 | Uchikawa et al. | |
| 2008/0246639 | A1* | 10/2008 | Sakai et al. | 341/107 |
| 2009/0319860 | A1 | 12/2009 | Sharon et al. | |
| 2010/0251059 | A1* | 9/2010 | Dielissen | 714/752 |

FOREIGN PATENT DOCUMENTS

JP 2009-100222 5/2009

OTHER PUBLICATIONS

Eran Sharon et al., "An Efficient Message-Passing Schedule for LDPC Decoding", Proceedings 2004 23$^{rd}$ IEEE Convention, 2004, pp. 223-226.

Yifei Zhang et al., "Toward Low LDPC-Code Floors: A Case Study", IEEE Transactions on Communications, Vol. 57, No. 6, Jun. 2009, pp. 1566-1573.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

A semiconductor memory device includes a semiconductor memory unit which stores LDPC encoded data, and a decoding unit which decodes the encoded data, wherein the decoding unit performs serial decoding using the posterior likelihood ratio as it is for a column element likelihood ratio when the absolute value of the posterior likelihood ratio is not smaller than a threshold and using the column element likelihood ratio as it is for the posterior likelihood ratio when the absolute value of the column element likelihood ratio is not smaller than the threshold, and if the decoding does not succeed even after a predetermined first cycle count of iterative processing is performed or if the number of syndrome errors becomes smaller than a predetermined first syndrome error count, the decoding unit shrinks the absolute values of at least some of posterior likelihood ratios and resets all prior likelihood ratios to "0."

12 Claims, 10 Drawing Sheets

FIG. 3

$$\begin{bmatrix} 1 & 0 & 1 & 1 & 0 & 0 \\ 1 & 1 & 0 & 0 & 1 & 0 \\ 1 & 0 & 0 & 0 & 1 & 1 \\ 0 & 1 & 1 & 1 & 0 & 0 \end{bmatrix}$$ ---- N(2)={1、2、5}

M(3)={1、4}

SEMICONDUCTOR MEMORY DEVICE AND DECODING METHOD

CROSS REFERENCE TO RELATED APPLICATION

This application claims the benefit of Japanese Application No. 2011-240483 filed in Japan on Nov. 1, 2011, the contents of which are incorporated herein by this reference.

FIELD

Embodiments described herein relate generally to a semiconductor memory device equipped with an error checking and correcting unit which uses low-density parity codes and to a decoding method for data encoded with the low-density parity codes.

BACKGROUND

In order to make semiconductor memory devices capable of high-density recording, error correction codes for digital data are under development. The error correction codes can be roughly divided into algebraic codes and codes prepared by probability-based iterative calculations. Regarding Low Density Parity Check codes (hereinafter referred to as "LDPC codes") which belong to the latter category, excellent performance close to the Shannon limit has been reported.

The LDPC codes are linear codes defined by a very sparse parity check matrix, i.e., a parity check matrix containing a small number of non-zero elements, and can be represented by a Tanner graph. Decoding involves exchanging results locally inferred by row processing and column processing between a bit node corresponding to each bit of code words connected on the Tanner graph and a check node corresponding to each parity check equation. Then, error correction is performed through repeated cycles of iterative processing which includes the row processing and column processing.

LDPC encoded data can be decoded by parallel processing on a relatively small circuit scale using the Sum-Product algorithm. Decoding by means of the Sum-Product algorithm can be roughly divided into batch decoding whereby row processing and column processing are performed in batches and serial decoding whereby row processing and column processing are performed serially with respect to each row index. The serial decoding is known to be faster in convergence speed and lower in memory consumption than the batch decoding.

Row operations for performing processing operations in a row direction of the parity check matrix in the Sum-Product algorithm involve nonlinear function calculations and thus particularly large amounts of operations, and therefore use the Min-Sum algorithm, which determines row operation data for each "1" element in each row of the parity check matrix by finding a minimum value among column operation data corresponding to the other "1" elements excluding the given element.

BRIEF DESCRIPTION OF THE DRAWINGS

FIG. 3 is a parity check matrix H with 4 rows and 6 columns (M=4, N=6);

DETAILED DESCRIPTION

First Embodiment

First, a configuration of a semiconductor memory device 1 according to a first embodiment of the present invention will be described with reference to FIG. 1.

The semiconductor memory device 1 is, for example, a storage device such as a memory card which stores data received from a host 4 such as a PC or a digital camera and transmits the stored data to the host 4, or an SSD (Solid State Drive) or the like, which is contained in the host 4 and configured to store boot data and the like of the host 4.

Figure 1:
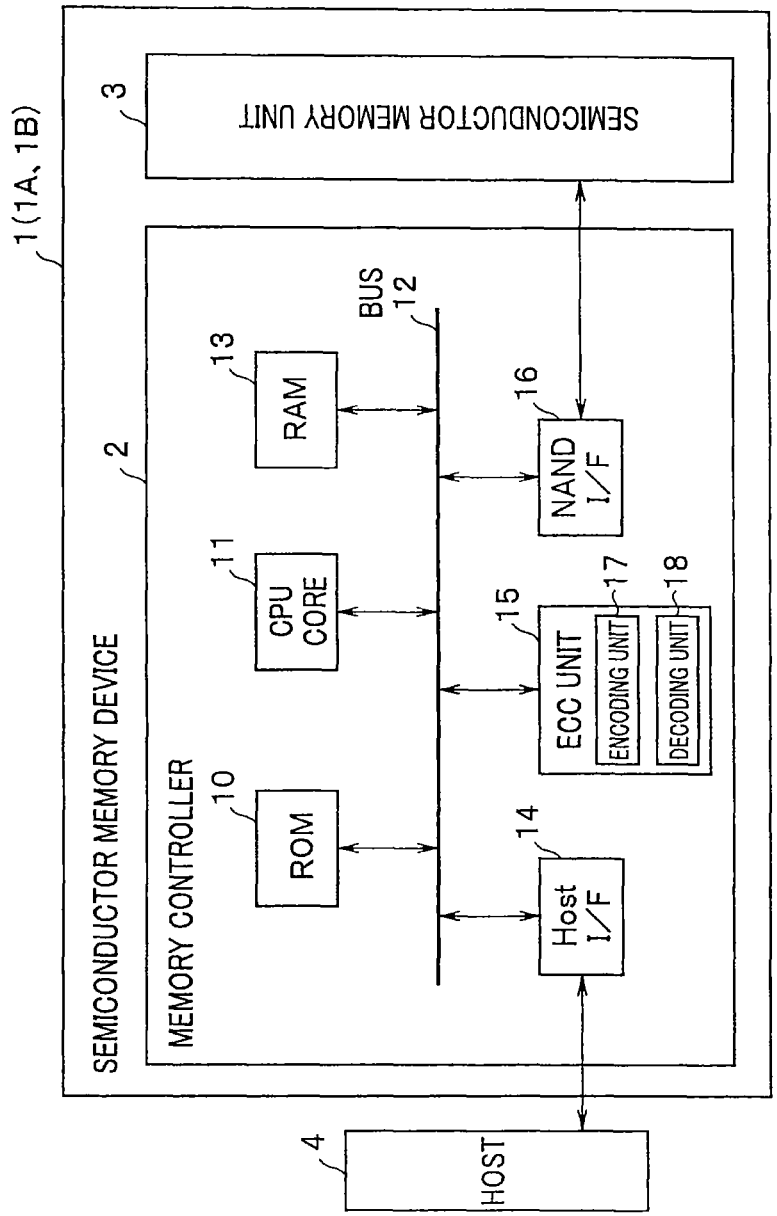
FIG. 1 is a configuration diagram of a semiconductor memory device according to an embodiment.

As shown in FIG. 1, the semiconductor memory device 1 includes a semiconductor memory unit 3 and a memory controller 2. The semiconductor memory unit 3 is a NAND flash memory and has plural memory cells which are unit cells. Using a CPU core 11 connected with other functional components via a bus 12, the memory controller 2 exchanges data with the host 4 via a host I/F (interface) 14 and exchanges data with the semiconductor memory unit 3 via a NAND I/F (interface) 16. Also, the memory controller 2 implements address management of the semiconductor memory unit 3 using FW (firmware) executed by the CPU core 11. The entire semiconductor memory device 1 is controlled through FW execution based on command input from the host 4. A ROM 10 contains a control program and the like of the semiconductor memory device 1 and a RAM 13 stores an address conversion table and the like needed for address management.

An error checking and correcting unit (ECC unit) 15 of the memory controller 2 includes an encoding unit 17 and a decoding unit 18, where the encoding unit 17 is configured to generate and assign error correction codes when data is stored and output encoded data and the decoding unit 18 is configured to decode read data during data reading and output decoded data.

The ECC unit 15 uses LDPC codes which are error correction codes for soft decision decoding. Although this will be described in detail later, to decode data encoded with LDPC codes, first a log likelihood ratio (LLR: hereinafter also referred to simply as a "likelihood ratio") which represents a likelihood ratio of each item of inputted bit data is calculated. Then, iterative processing which includes row processing and column processing is repeated based on a parity check matrix to update the likelihood ratios and thereby perform an error correction process.

Figure 2:
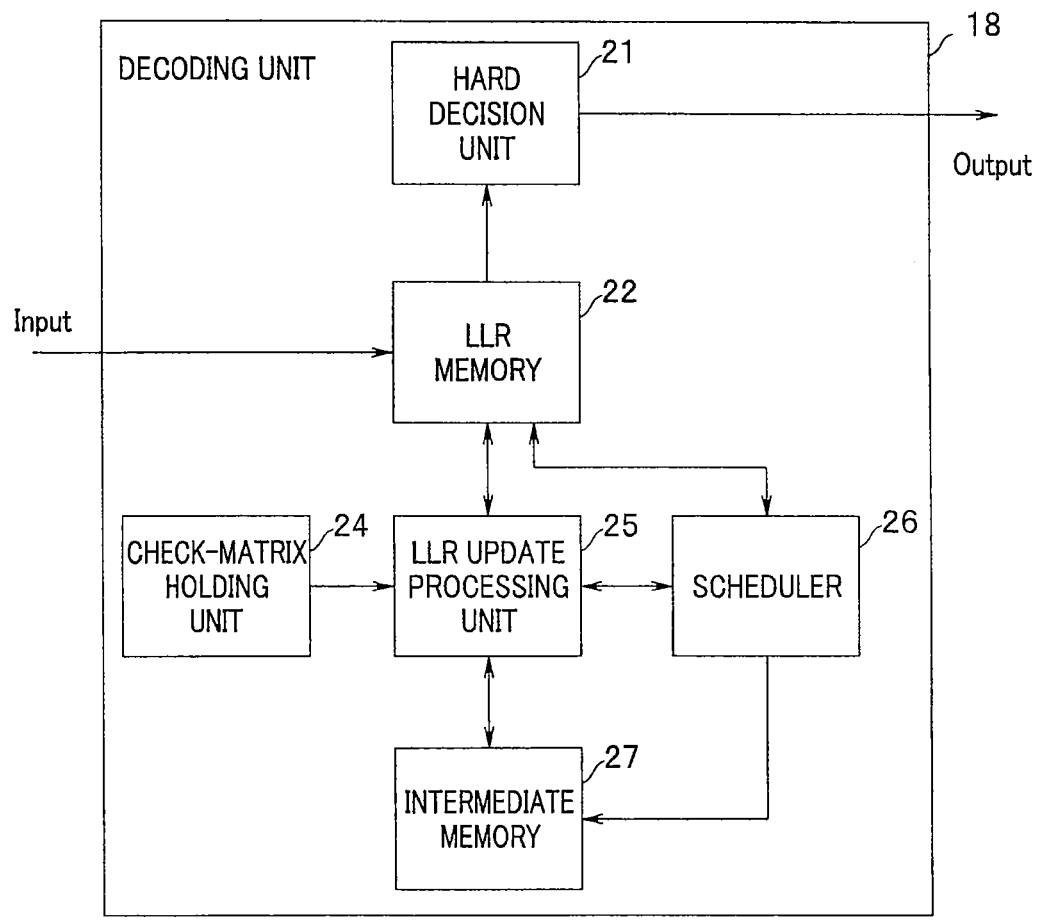
FIG. 2 is a configuration diagram of a decoding unit of a semiconductor memory device according to a first embodiment.

As shown in FIG. 2, the decoding unit 18 includes a hard decision unit 21, a log likelihood ratio memory 22, a parity check matrix holding unit 24, an LLR update processing unit 25, a scheduler 26, and an intermediate memory 27.

The decoding unit 18 receives an input LLR Fn of encoded data (e.g., data frame) from a signal processing unit (not shown) in a preceding stage and decodes the encoded data. The decoding unit 18 performs serial decoding whereby row processing and column processing are performed serially with respect to each row index.

Received-word data inputted from the signal processing (not shown) in the preceding stage has the same number of elements as the number of bits in code words, and each element represents the LLR of corresponding bit data. As shown in Expression 1, the LLR is a logarithmic value (natural logarithm) of the ratio of the probability P(x=0) of a data bit being "0" to the probability P(x=1) of a data bit being "1."

$$\ln\frac{P(x=0)}{P(x=1)} \qquad \text{(Expression 1)}$$

The LLR memory 22 stores received-word data (input LLR) Fn and holds the received-word data by updating the received-word data as an output LLR (posterior LLR) qn until decoding is completed. That is, the input LLR Fn is updated to a posterior LLR qn by the first run of iterative processing, and then the posterior LLR qn is updated to a new posterior LLR qn by each run of iterative processing and held in the LLR memory 22.

The parity check matrix holding unit 24 holds information of an M-row by N-column parity check matrix. The parity check matrix H is common to both encoding unit 17 and decoding unit 18. The information of the parity check matrix H is read out by the LLR update processing unit 25 and the scheduler 26 as required.

FIG. 3 illustrates a parity check matrix H with 4 rows and 6 columns (M=4, N=6) by way of example. Code length of the encoded data defined by the parity check matrix H is 6 bits and parity length is 4 bits. The number of "1"s contained in the mth row (m is an integer not larger than M) of the parity check matrix H is referred to as a row weight of the mth row. The number of "1"s contained in the nth column (n is an integer not larger than N) of the parity check matrix H is referred to as a column weight of the nth column.

A set of column indices which represent column positions of "1"s contained in the mth row is designated by N(m) and a set of row indices which represent row positions of "1"s contained in the nth column is designated by M(n). In the example of FIG. 2, N(2)={1,2,5}, M(3)={1,4}.

The LLR update processing unit 25 performs row processing and column processing on a row index m reported from the scheduler 26, using the output LLR (posterior LLR) qn inputted from the LLR memory 22 and a row element LLR (prior LLR) (shown below) which is row operation data inputted from the intermediate memory 27.

$$r_{mn}^{i-1}$$

The row processing includes syndrome (reliability coefficient) calculation. The column processing includes column operations and update processes. The LLR update processing unit 25 writes the row element LLRs (prior LLRs) into the intermediate memory 27 and writes the output LLRs (posterior LLRs) qn into the LLR memory 22. Also, the LLR update processing unit 25 reports syndromes and row indices calculated in the row processing to the scheduler 26. Column element LLRs qmn (column operation data) are held, for example, in the LLR update processing unit 25. That is, the LLR update processing unit 25 may include column operation data storage means configured to store the column element LLRs qmn (column operation data) by row number and column number in response to a write request.

The row operation and column operation performed with respect to the row index m using the Min-Sum algorithm will be described below using expressions.

<Column Operation>

In serial decoding, the column element LLR qmn is calculated by subtracting the row element LLR (prior LLR) from the output LLR ("posterior LLR" in the second and subsequent cycles) qn as shown in Expression 2.

$$q_{mn}=q_n-r_{mn}^{i-1} \qquad \text{(Expression 2)}$$

If a quantization bit rate is low, the output LLR (posterior LLR) qn is clipped to quantization bit width when processed, resulting in a smaller absolute value than an original value. The column element LLR qmn calculated by subtracting the row element LLR (prior LLR) from the clipped output LLR (posterior LLR) qn contains a clipping error. Serial decoding is more prone to deterioration of error rate characteristics due to the clipping error than batch decoding. In particular, when the quantization bit rate is low, serial decoding cannot necessarily be said to have good decoding efficiency, due to the effect of the clipping error.

A sufficiently large absolute value of the posterior LLR qn means high reliability of the posterior LLR qn. The inventor has found that if the absolute value of the posterior LLR qn is equal to or larger than a threshold thr which is a predetermined large value, better decoding efficiency is available when the posterior LLR qn is not updated than when updated. Incidentally, the threshold thr is calculated in advance by a numerical experiment such as a computer simulation.

That is, when the absolute value of the posterior LLR qn is smaller than the threshold thr, the semiconductor memory device 1 updates the posterior LLR qn by performing the column operation given by Expression 2. On the other hand, when the absolute value of the posterior LLR qn is equal to or larger than the threshold thr, the posterior LLR qn is used as it is for the column element LLR qmn, as shown in Expression 3.

$$q_{mn}=q_n-r_{mn}^{i-1}(|q_n|<thr) \qquad \text{(Expression 2)}$$

$$q_{mn}=q_n(|q_n|\geq thr) \qquad \text{(Expression 3)}$$

where i is a cycle count (the number of iterations) of iterative processing. At the start of decoding (i=1), since the row element LLR (prior LLR)=0, the column element LLR qmn=the output LLR (posterior LLR) qn=the input LLR Fn.

<Row Operation>

In the row operation, the syndrome $$s_m^i$$

and the row element LLR (prior LLR)

$$r_{mn}^i$$

are calculated using Expressions 4 and 5, respectively.

$$r_{mn}^i = \alpha \prod_{n' \in N(m)\setminus n} \text{sign}(q_{mn'}) \times \min_{n' \in N(m)\setminus n} (|q_{mn'}|) \qquad \text{(Expression 4)}$$

$$s_{mn}^i = \prod_{n \in N(m)} \text{sign}(q_{mn}) \times \min_{n \in N(m)} (|q_{mn}|) \qquad \text{(Expression 5)}$$

where N(m) represents a set N(m) of column indices with a value of "1" in the parity-check equation of the row index m, N(m)\n represents a subset of column indices obtained by excluding n from the set N(m), and sign(x) represents a sign of x.

Also, $$\min_{n \in N(m)} (|q_{mn}|)$$

represents the column element LLR qmn with the smallest absolute value out of the column element LLRs qmn corresponding to the column indices included in the column index set N(m).

Furthermore, $$\min_{n' \in N(m)\backslash n} (|q_{mn'}^{i-1}|)$$

represents the column element LLR qmn with the smallest absolute value out of the column element LLRs qmn corresponding to the column indices included in the column index set N(m)\n. On the other hand, a Min-Sum coefficient α described later is reported from the scheduler 26.

The row element LLR (prior LLR) of each column index $$r_{mn}^{i}$$

is calculated using Expressions 4 and 5, and then the output LLR (posterior LLR) qn is updated based on Expression 6. On the other hand, as shown in Expression 7, the column element LLR qmn equal to or larger than the threshold thr is used as it is for the posterior LLR qn.

$$q_n = q_{mn} + r_{mn}^{i} (|q_{mn}| < thr) \quad \text{(Expression 6)}$$

$$q_n = q_{mn} (|q_{mn}| \geq thr) \quad \text{(Expression 7)}$$

In the second and subsequent cycles of iterative processing, the posterior LLR qn updated in the previous cycle of iterative processing is used as the output LLR (posterior LLR) qn. In this way, the LLR update processing unit 25 updates the output LLR (posterior LLR) qn by performing the row processing and column processing on a row by row basis.

Figure 4:
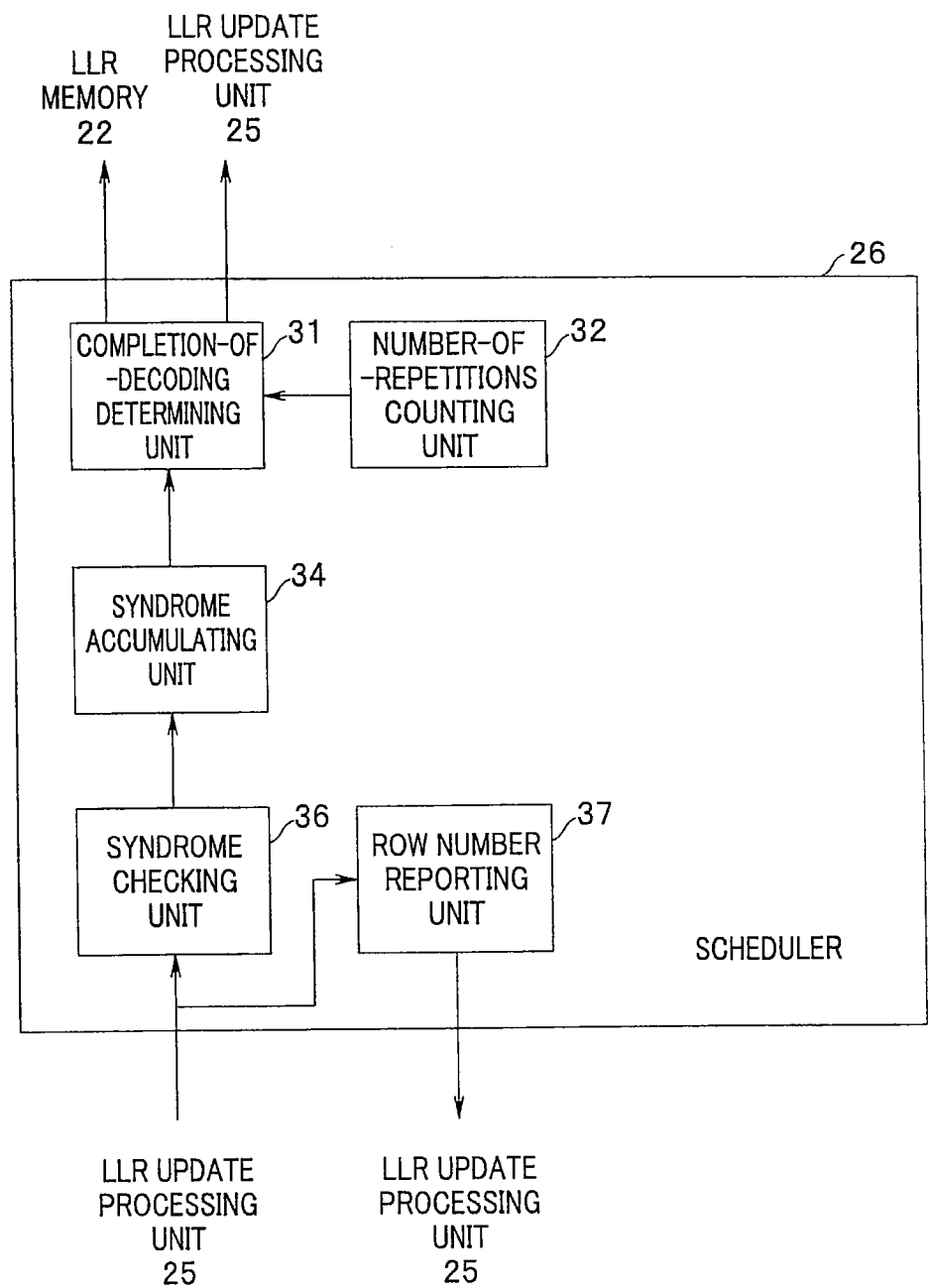
FIG. 4 is a configuration diagram of a scheduler of the semiconductor memory device according to the first embodiment.

The scheduler 26 controls an entire decoding process. A configuration of the scheduler 26 is shown in FIG. 4. The scheduler 26 includes a completion-of-decoding determining unit 31, a number-of-iterations counting unit 32, a syndrome accumulating unit 34, a syndrome checking unit 36, and a row number reporting unit 37.

The syndrome checking unit 36 outputs "True (0)" if the syndrome reported from the LLR update processing unit 25 is "positive" and outputs "False (1)" if the syndrome reported from the LLR update processing unit 25 is "negative," to the syndrome accumulating unit 34.

The syndrome accumulating unit 34 obtains a cumulative syndrome value by accumulating syndrome check results ("True (0)" or "False (1)") for all rows as a syndrome check result is inputted in relation to each row index from the syndrome checking unit 36. The cumulative syndrome value represents the number of syndrome errors. The cumulative syndrome value is "True (0)" only when the syndrome check results of all the rows are "True (0)." If there is any row whose syndrome check result is "False (1)," the cumulative syndrome value is "False," taking a value other than "0." The syndrome accumulating unit 34 outputs the cumulative syndrome value to the completion-of-decoding determining unit 31.

When the cumulative syndrome value inputted from the syndrome accumulating unit 34 is "True" or when the cycle count i reported from the number-of-iterations counting unit 32 reaches a predetermined maximum cycle count Imax, the completion-of-decoding determining unit 31 determines that the decoding process is complete. If it is determined that the decoding process is complete, the completion-of-decoding determining unit 31 instructs the LLR memory 22 to output the currently held posterior LLR qn to the hard decision unit 21. On the other hand, if it is determined that the decoding process is not complete, the completion-of-decoding determining unit 31 notifies the LLR update processing unit 25 that a next cycle of iterative processing is started.

The row number reporting unit 37 increments a row index number reported from the LLR update processing unit 25 and reports the incremented row index number to the LLR update processing unit 25. However, if the row index number reported is M, meaning the last row, then "0" is reported.

As can be seen from the description of the LLR update processing unit 25, in response to a write request from the LLR update processing unit 25, the intermediate memory 27 stores the row element LLR (prior LLR) calculated by the LLR update processing unit 25.

The hard decision unit 21 determines whether the output LLR (posterior LLR) inputted from the LLR memory is positive or negative, and selects "0" when the output LLR (posterior LLR) is positive, or selects "1" when the output LLR (posterior LLR) is negative. Hard decision data produced as a result of bit-by-bit determination, indicating either "0" or "1," is outputted to the signal processing unit (not shown) in a subsequent stage.

Figure 5:
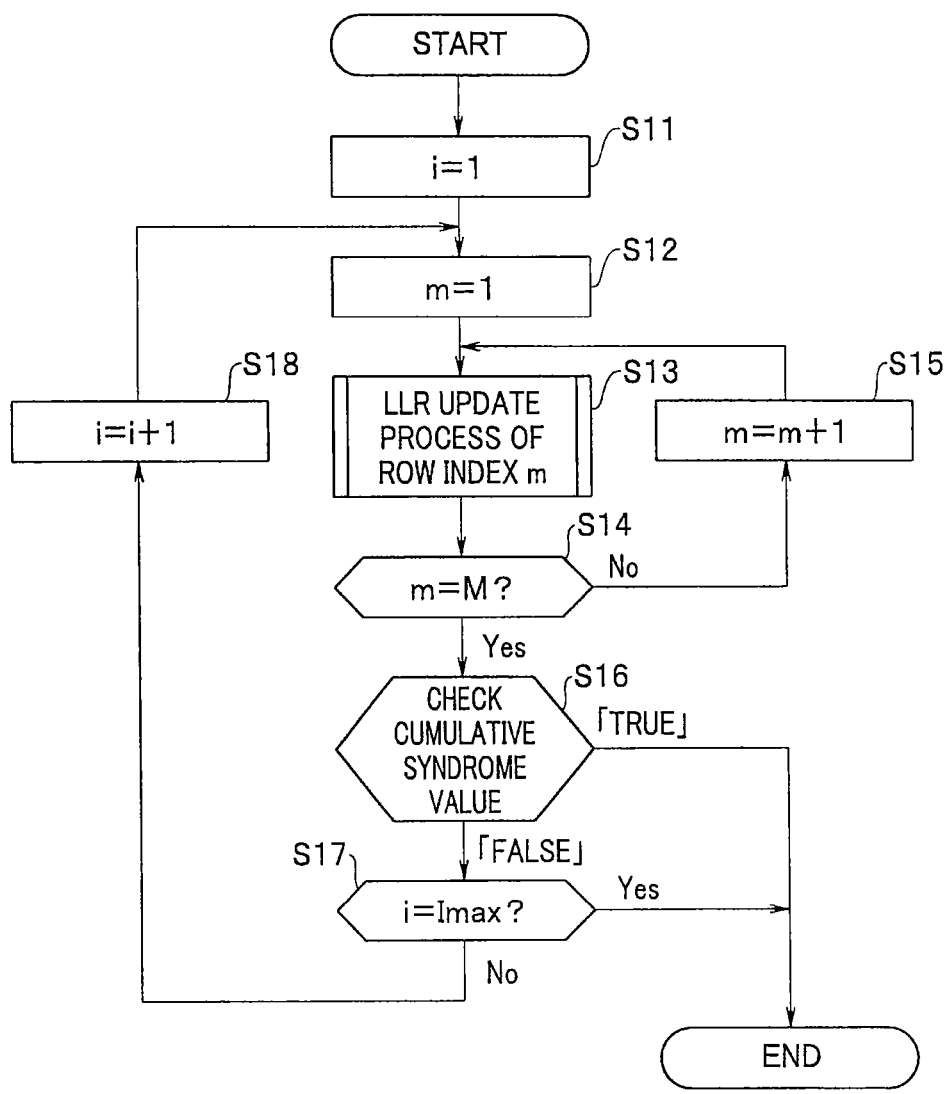
FIG. 5 is a flowchart for illustrating a processing flow of a decoding method according to the first embodiment.
Figure 6:
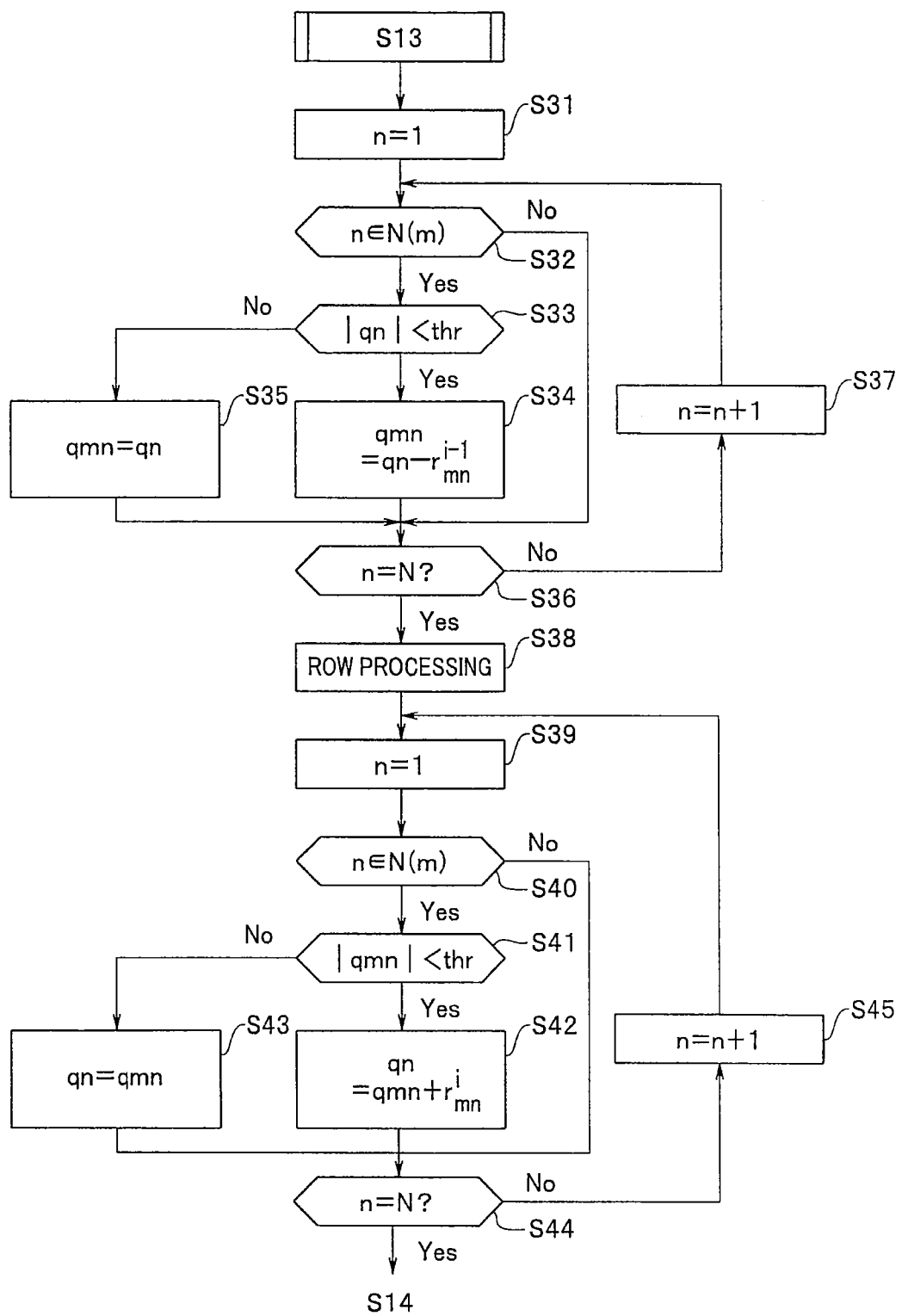
FIG. 6 is a flowchart for illustrating a processing flow of the decoding method according to the first embodiment.

Now, an operational flow of the decoding unit 18 will be described with reference to flowcharts of FIGS. 5 and 6, where m represents a row index, M represents the number of rows in a parity check matrix, i represents the number of iterations (cycle count) of iterative processing, and Imax represents a maximum number of iterations.

<Step S11>

When received-word data (input LLR Fn) is inputted from the signal processing unit (not shown) of the preceding stage, the first run (first cycle) of iterative processing is started. The input LLR Fn is held in the LLR memory 22 as the output LLR (posterior LLR) qn until the decoding is completed while being updated by the iterative processing.

First, the cycle count i of the iterative processing is set to "1."

<Step S12>

The row index m of the row to be subjected to an update process is set to "1."

<Step S13>

An LLR update process is performed with respect to the row index m.

Now, operation of the LLR update processing unit 25 will be described with reference to the flowchart of FIG. 6.

<Step S31>

A column index n to be subjected to an update process is set to "1."

<Step S32>

It is determined whether the column index n is included in the column index set N(m) of the mth column of the parity check matrix H. If the column index n is included (Yes), the flow goes to Step S33. If the column index n is not included (No), the flow goes to Step S36.

<Step S33>

It is determined whether the absolute value of the posterior LLR qn is smaller than the threshold thr. If the absolute value is smaller than the threshold thr (Yes), the flow goes to Step S34, but if the absolute value is equal to or larger than the threshold thr (No), the flow goes to Step S35.
<Step S34>
The column element LLR qmn is calculated using Expression 2.
<Step S35>
As shown in Expression 3, the output LLR (posterior LLR) qn is used as it is for the column element LLR qmn.
<Step S36>
It is determined whether the column index n is the last column index N. If the column index n is the last column index N, the flow goes to Step S38, but if the column index n is not the last column index N, the flow goes to Step S37.
<Step S37>
The column index n to be subjected to an update process is incremented and the process beginning with Step S32 is repeated.
<Step S38>
A syndrome and the row element LLR (prior LLR) are calculated using Expressions 4 and 5.
<Step S39>
The column index n is set to "1."
<Step S40>
It is determined whether the column index n is included in the column index set N(m) of the mth row. If the column index n is included (Yes), the flow goes to Step S41. If the column index n is not included (No), the flow goes to Step S44.
<Step S41>
It is determined whether the absolute value of the column element LLR qmn is smaller than the threshold thr. If the absolute value is smaller than the threshold thr (Yes), the flow goes to Step S42, but if the absolute value is equal to or larger than the threshold thr (No), the flow goes to Step S43.
<Step S42>
The output LLR (posterior LLR) qn is calculated using Expression 6.
<Step S43>
As shown in Expression 7, the column element LLR qmn is used as it is for the output LLR (posterior LLR) qn.
<Step S44>
It is determined whether the column index n is the index N which indicates the last column. If the column index n is the last column index N (Yes), the flow goes to Step S14, but if the column index n is not the last column index N, the flow goes to Step S45.
<Step S45>
The column index n is incremented and the process beginning with Step S39 is repeated.
<Step S14>
It is determined whether the row index m is the last row index M.
<Step S15>
If the determination in Step S14 is "No," the row index m is incremented and the process beginning with Step S13 is repeated.
<Step S16>
If the determination in Step S14 is "Yes," the cumulative syndrome value is checked. If the cumulative syndrome value is "True," the decoding process is finished after a hard decision.
<Step S17>
If the determination in Step S16 is "False," it is determined whether the cycle count i of the iterative processing has reached the maximum cycle count Imax. If the maximum cycle count Imax has been reached (Yes), the decoding process is finished after a hard decision. If the cycle count i is less than the maximum cycle count Imax (No), the flow returns to Step S12 to perform a next cycle of iterative processing.

As described above, in applying a serial method using the Sum-Product algorithm to encoded data encoded with low-density parity check codes, the decoding method according to the embodiment uses the posterior LLR as it is for the column element LLR in a column operation if the absolute value of the posterior LLR is equal to or larger than a threshold, and uses the column element LLR as it is for the posterior LLR in an update process of the posterior LLR if the absolute value of the column element LLR is equal to or larger than the threshold.

Although the decoding method according to the embodiment uses serial decoding which is fast in convergence speed and low in memory consumption, the decoding method is not subject to reduction in decoding efficiency caused by the effect of clipping errors. Consequently, the semiconductor memory device 1 has good decoding efficiency.

Incidentally, although in the example described above, the Min-Sum algorithm is used as the Sum-Product algorithm for decoding, similar effects can be achieved using the Modified-Min-Sum algorithm or the like.

Second Embodiment

Next, a semiconductor memory device 1A according to a second embodiment and a decoding method according to the second embodiment will be described. The semiconductor memory device 1A according to the second embodiment and the decoding method according to the second embodiment are similar to the semiconductor memory device 1 according to the first embodiment and the decoding method according to the first embodiment, and thus the same components as those in the first embodiment are denoted by the same symbols as the corresponding components and description thereof will be omitted.

Figure 7:
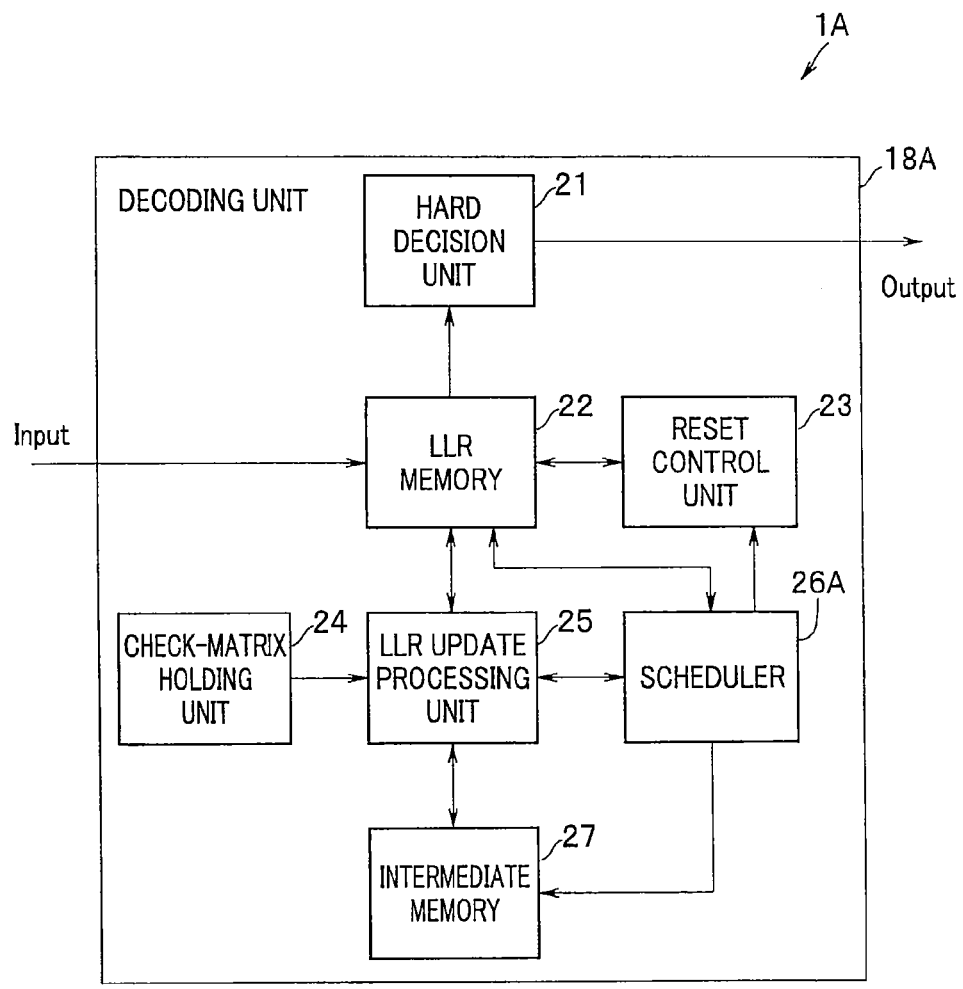
FIG. 7 is a configuration diagram of a decoding unit of a semiconductor memory device according to a second embodiment.

As shown in FIG. 7, a decoding unit 18A of the semiconductor memory device 1A according to the second embodiment performs decoding using the Min-Sum algorithm and includes a reset control unit 23.

Figure 8:
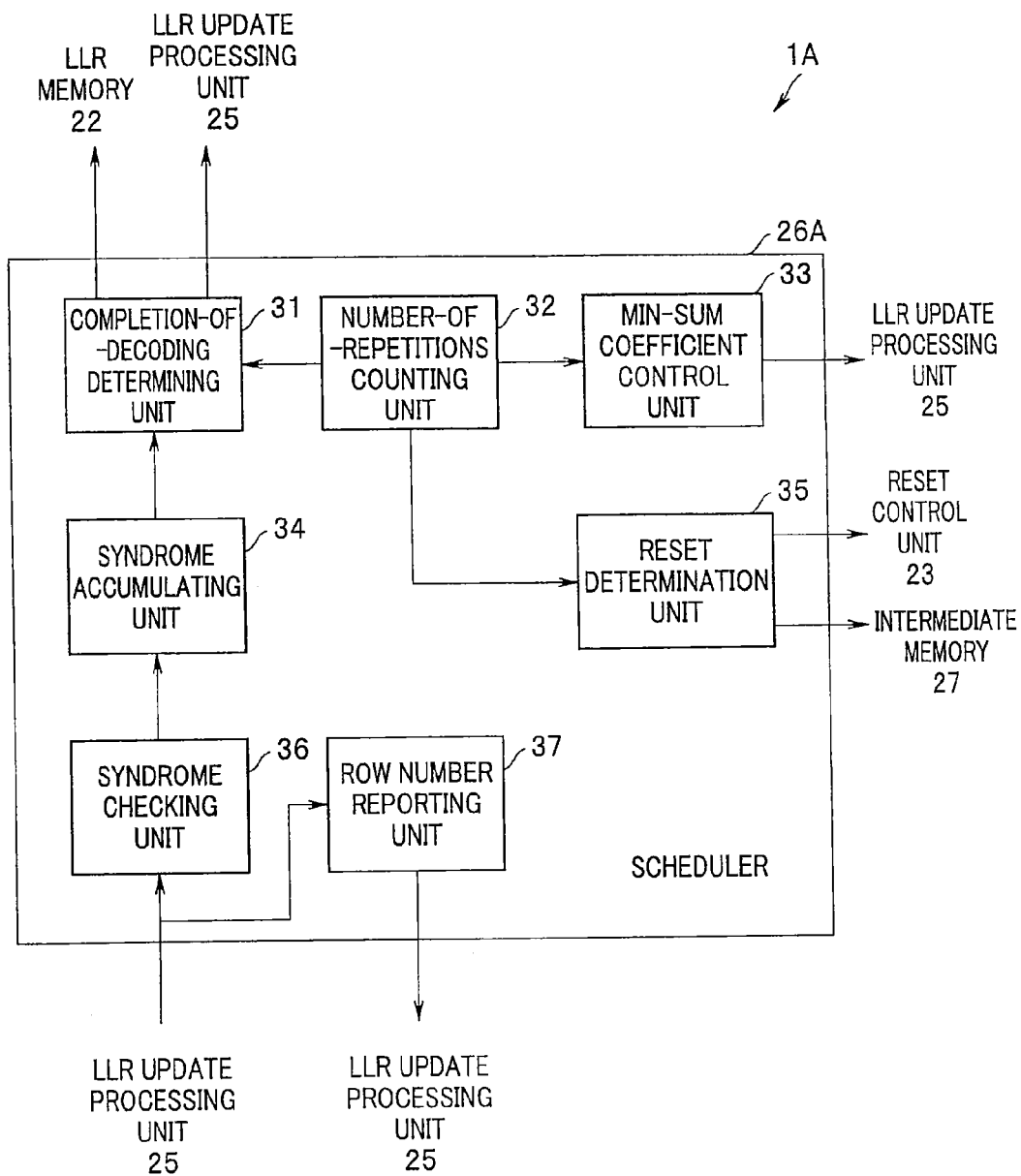
FIG. 8 is a configuration diagram of a scheduler of the semiconductor memory device according to the second embodiment.

Furthermore, as shown in FIG. 8, a scheduler 26A of the semiconductor memory device 1A according to the second embodiment includes a Min-Sum coefficient control unit 33 and a reset determination unit 35.

As described already, the decoding performed by the decoding unit 18 of the semiconductor memory device 1 according to the first embodiment does not perform an update process when the absolute value of the posterior LLR qn is equal to or larger than the threshold thr. However, in an initial stage (initial cycle) of iterative processing, there is no denying that the posterior LLR qn could become equal to or larger than the threshold thr in absolute value while having the wrong sign ("positive" or "negative"). In that case, the posterior LLR qn of the bit data is not updated in the subsequent iterative processing, resulting in a decoding error.

In contrast, in the decoding unit 18A, the reset control unit 23 performs a reset process if the decoding does not succeed even after a predetermined cycle count I1 of iterative processing.

That is, when the cycle count i reported from the number-of-iterations counting unit 32 reaches a first count I1, the reset determination unit 35 sends a reset request to the reset control unit 23 and the intermediate memory 27.

Upon receiving the reset request from the scheduler 26A, the intermediate memory 27 resets all the row element LLRs (prior LLRs)

$$r_{mn}^{i}$$

held in the intermediate memory 27 to "0."

Upon receiving the reset request from the scheduler 26A, the reset control unit 23 reads posterior LLRs qn out of the LLR memory 22 and shrinks all the posterior LLRs qn using Expression 8.

$$q_n = q_n/A \quad \text{(Expression 8)}$$

where A is a value larger than 1. Preferably A is 5% to 50% of thr. This range enables a high decoding efficiency without significant reduction in decoding speed.

As is clear from Expression 8, the term "shrink" means "reducing the absolute value." Also, for example, only a half of the posterior LLRs qn whose absolute values are equal to or larger than the threshold may be shrunk. That is, the absolute values of at least some of the posterior LLRs qn may be shrunk.

Also, the reset control unit 23 can achieve effects similar to the shrinking process by shrinking the absolute values of all the posterior LLRs qn to a predetermined value B using Expression 9 instead of shrinking the posterior LLRs qn. That is, all the posterior LLRs qn are reset to either of two values: a value with a "positive" sign and an absolute value of B, and a value with a "negative" sign and an absolute value of B.

$$q_n = \text{sign}(q_n) \times B \quad \text{(Expression 9)}$$

where B<thr. Preferably B is 5% to 50% of thr. This range enables a high decoding efficiency without significant reduction in decoding speed.

Also, for example, only a half of the output LLRs (posterior LLRs) qn whose absolute values are equal to or larger than the threshold may have the absolute values shrunk to B. That is, at least some of the output LLRs (posterior LLRs) qn may be set to either of two values: a positive value and negative value with an absolute value of B.

On the other hand, to prevent update processing failure due to the wrong sign in the initial stage of iterative processing (initial cycle of processing), it is also useful to make it hard for the absolute value of the posterior LLR qn to become large in the initial stage. In order to make it hard for the absolute value of the posterior LLR qn to become large, a small value can be used as the Min-Sum coefficient α in Expression 4.

To use this method, the Min-Sum coefficient control unit 33 reports a first Min-Sum coefficient α1 which is a small value to the LLR update processing unit 25 in the initial stage in which the cycle count i reported from the number-of-iterations counting unit 32 is not larger than a predetermined second count I2, but reports a second Min-Sum coefficient α2 larger than the first Min-Sum coefficient α1 to the LLR update processing unit 25 after the cycle count i exceeds the predetermined second count I2.

Preferably the first Min-Sum coefficient α1 is 50% to 90% of the second Min-Sum coefficient α2. This range enables a high decoding efficiency without significant reduction in decoding speed. Also, preferably the second count I2 is 5 to 50% of the maximum number of iterations Imax. This range enables a high decoding efficiency without significant reduction in decoding speed.

Operation of the Min-Sum coefficient control unit 33 can lower an error floor and prevent deterioration of waterfall characteristics.

Figure 9:
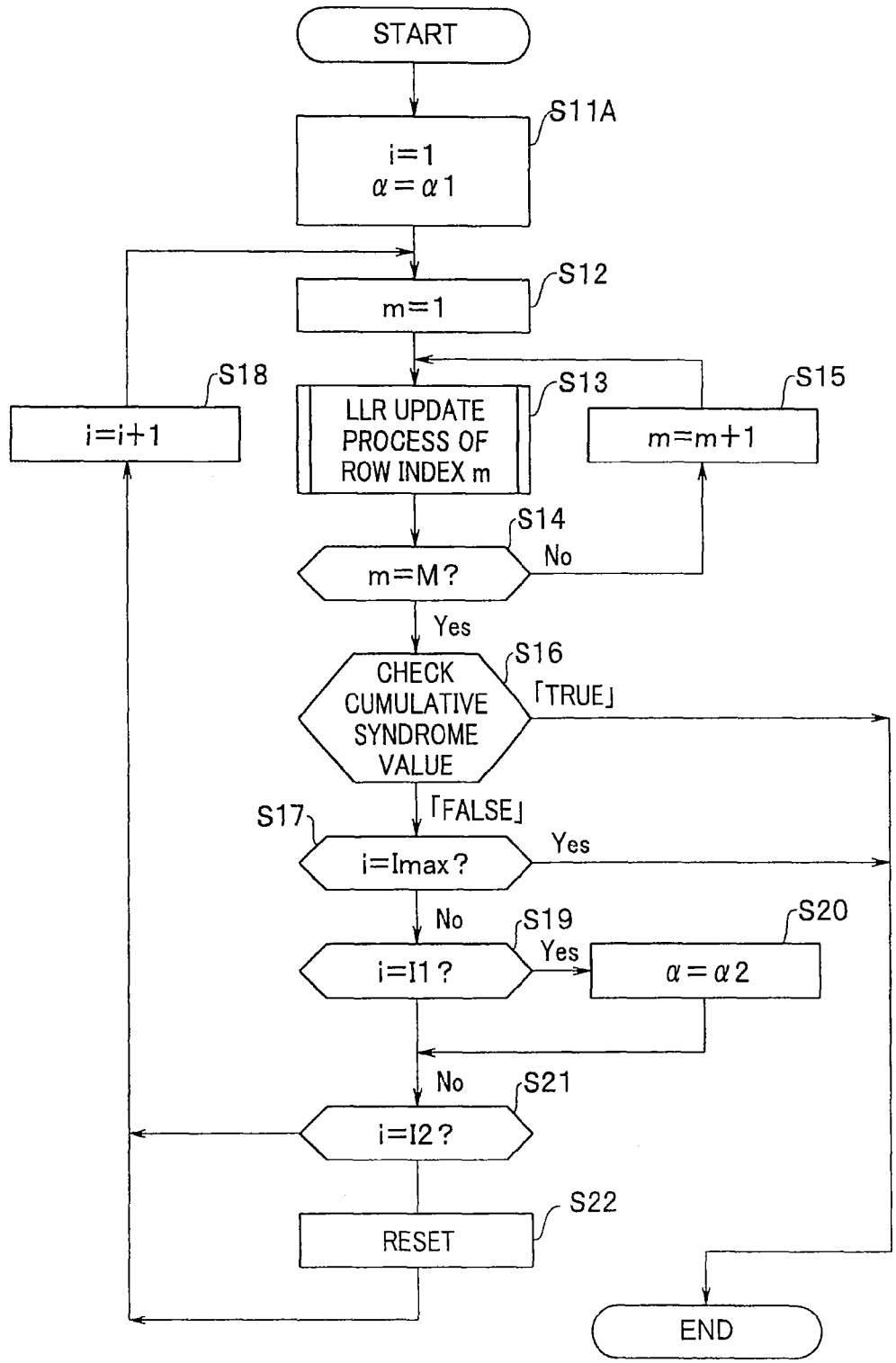
FIG. 9 is a flowchart for illustrating a processing flow of a decoding method according to the second embodiment.

An operational flow of the decoding unit 18A will be described below with reference to a flowchart of FIG. 9. FIG. 9 is similar to FIG. 5, and thus only different process steps will be described.

<Step S11A>
The cycle count i of the iterative processing is set to "1" and the Min-Sum coefficient α is set to the first Min-Sum coefficient α1.

<Step S17>
If the determination in Step S16 is "False," it is determined whether the cycle count i of the iterative processing has reached the maximum cycle count Imax. If the cycle count i is less than the maximum cycle count Imax (No), the flow goes to Step S19.

<Step S19>
If the cycle count i of the iterative processing is equal to the predetermined second count I2 (Yes), the flow goes to Step S20. On the other hand, if the cycle count i is less than the predetermined second count I2 (No), the flow goes to Step S21.

<Step S20>
The Min-Sum coefficient α is changed from the first Min-Sum coefficient α1 to the second Min-Sum coefficient α2, and the flow goes to Step S21.

<Step S21>
It is determined whether the cycle count i is equal to the first count I1. If the determination is Yes, the flow goes to Step S22. On the other hand, if the determination is No, the flow goes to Step S18.

In addition to providing the same advantages as the semiconductor memory device 1, the semiconductor memory device 1A is less prone to decoding errors caused by an update processing failure due to the wrong sign in the initial stage (initial cycle) of iterative processing and has good decoding efficiency.

Incidentally, the reset determination unit 35 may send a reset request according to a syndrome error count. Also, the Min-Sum coefficient α may be changed according to the syndrome error count.

That is, the reset control unit 23 may shrink the absolute values of at least some of the posterior LLRs and reset all the prior LLRs to "0" when the number of syndrome errors becomes smaller than a predetermined first syndrome error count.

Also, the reset control unit 23 may reset the absolute values of at least some of the posterior LLRs to a predetermined value when the number of syndrome errors becomes smaller than the predetermined first syndrome error count.

Furthermore, regarding the order of an update process, also preferably the update process is started, for example, beginning with the row in which the syndrome reported from the LLR update processing unit 25 is "1," i.e., the row containing a syndrome error, rather than in the order of row indices.

Third Embodiment

Next, a semiconductor memory device 1B according to a third embodiment and a decoding method according to the third embodiment will be described. The semiconductor memory device 1B according to the third embodiment and the decoding method according to the third embodiment are similar to the semiconductor memory device 1 according to the first embodiment and the decoding method according to the first embodiment, and thus the same components as those in the first embodiment are denoted by the same symbols as the corresponding components and description thereof will be omitted.

Figure 10:
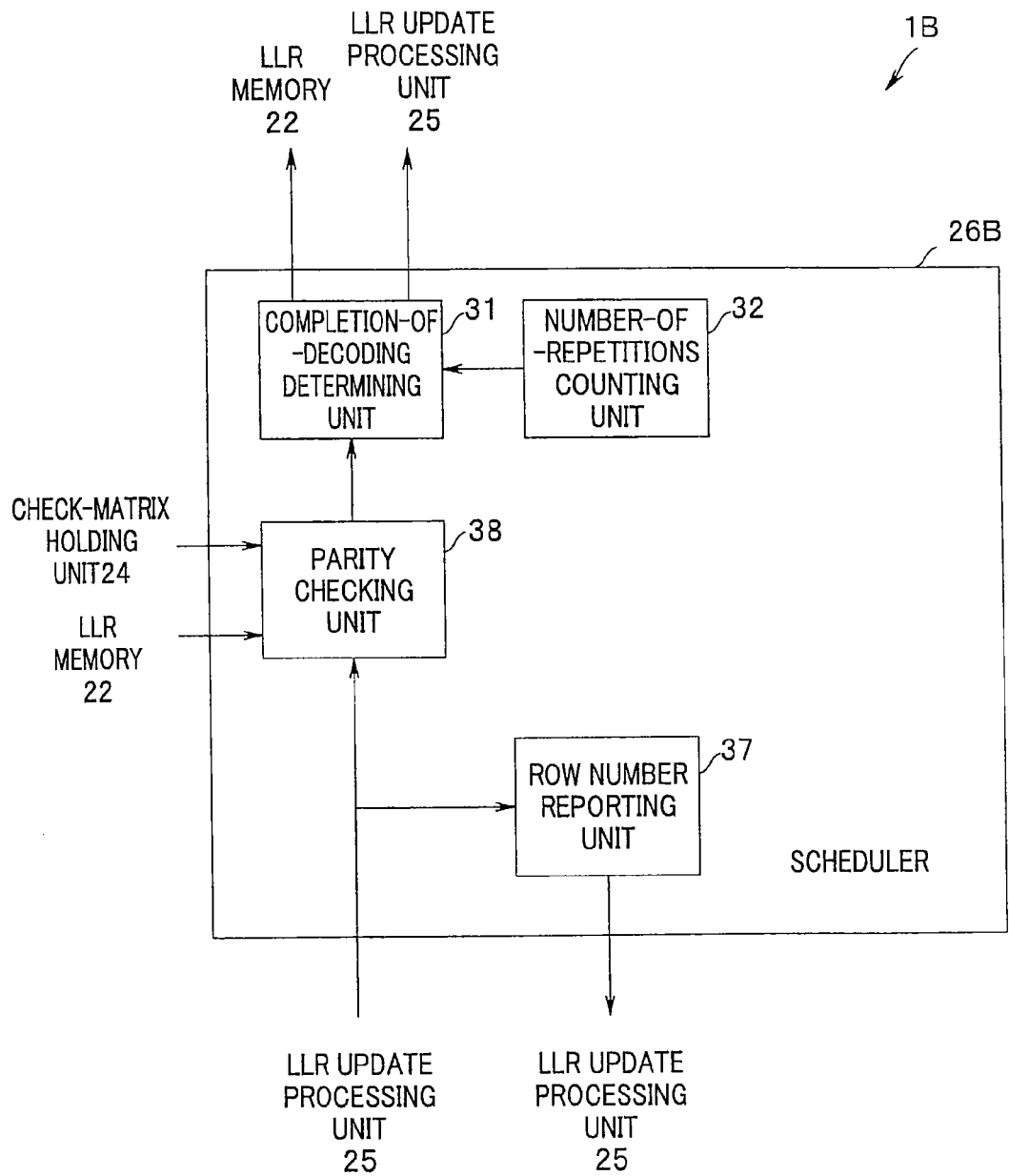
FIG. 10 is a configuration diagram of a scheduler of the semiconductor memory device according to a third embodiment.

As shown in FIG. 10, a scheduler 26B of a decoding unit 18B of the semiconductor memory device 1B includes a parity checking unit 38. The scheduler 26B performs a parity check every M rows and thereby determines whether decoding is complete, instead of using a cumulative syndrome value.

When the row index reported from the LLR update processing unit 25 indicates the last row M, the parity checking unit 38 reads the posterior LLR qn out of the LLR memory 22, determines whether the posterior LLR qn is positive or negative, and carries out a hard decision: selects "0" when the posterior LLR qn is "positive" or selects "1" when the posterior LLR qn is "negative." For the hard decision, a hard decision unit similar to the hard decision unit 21 may be used.

Subsequently, based on a result of the hard decision, a parity check is made using an expression below.

$$U = \hat{c}H^T$$

where U is a parity check vector, $$\hat{c}$$

is the result of the hard decision, and H is a parity check matrix.

The parity checking unit 38 reports "True" to the completion-of-decoding determining unit 31 when the parity check vector is an all-zero vector, and reports "False" when the parity check vector is not an all-zero vector.

When a signal reported from the parity checking unit 38 is "True" or when the cycle count i reported from the number-of-iterations counting unit 32 reaches the maximum number of iterations Imax, the completion-of-decoding determining unit 31 determines that the decoding is complete.

The semiconductor memory device 1B and decoding method according to the third embodiment provide advantages similar to the semiconductor memory device 1 according to the first embodiment and the decoding method according to the first embodiment.

The semiconductor memory device 1B and decoding method according to the third embodiment also provide similar advantages when combined with the semiconductor memory device 1A according to the second embodiment and the decoding method according to the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a semiconductor memory unit configured to store encoded data encoded with an LDPC code; and
a decoding unit configured to decode the encoded data using a Min-Sum algorithm or a Modified-Min-Sum algorithm,
wherein the decoding unit performs serial decoding by repeatedly performing iterative processing which includes row processing and column processing and thereby updating a posterior likelihood ratio for each row of a parity check matrix, and uses the posterior likelihood ratio as it is for a column element likelihood ratio when an absolute value of the posterior likelihood ratio is equal to or larger than a threshold and uses the column element likelihood ratio as it is for the posterior likelihood ratio when an absolute value of the column element likelihood ratio is equal to or larger than the threshold, and
if the decoding does not succeed even after a predetermined first cycle count of the iterative processing is performed or if a number of syndrome errors becomes smaller than a predetermined first syndrome error count, the decoding unit shrinks absolute values of at least some of posterior likelihood ratios and resets all prior likelihood ratios to "0."

2. The semiconductor memory device according to claim 1, wherein
the decoding unit calculates the column element likelihood ratio by subtracting a row element likelihood ratio from the posterior likelihood ratio when the absolute value of the posterior likelihood ratio is smaller than the threshold and calculates the posterior likelihood ratio by adding the row element likelihood ratio to the column element likelihood ratio when the absolute value of the column element likelihood ratio is smaller than the threshold.

3. The semiconductor memory device according to claim 2, wherein
the decoding unit uses the Modified-Min-Sum algorithm.

4. The semiconductor memory device according to claim 3, wherein
the decoding unit shrinks the absolute values of the at least some of the posterior likelihood ratios to 5% to 50% of the threshold.

5. The semiconductor memory device according to claim 3, wherein
the decoding unit uses a first Min-Sum coefficient until a predetermined second cycle count of iterative processing is reached, and uses a second Min-Sum coefficient larger than the first Min-Sum coefficient when the second cycle count of iterative processing is exceeded.

6. The semiconductor memory device according to claim 5, wherein
the first Min-Sum coefficient is 50% to 90% of the second Min-Sum coefficient.

7. A decoding method for decoding encoded data encoded with an LDPC code, using a Min-Sum algorithm or a Modified-Min-Sum algorithm, the decoding method comprising:
performing serial decoding by repeatedly performing iterative processing which includes row processing and column processing and thereby updating a posterior likelihood ratio for each row of a parity check matrix; using the posterior likelihood ratio as it is for a column element likelihood ratio when an absolute value of the posterior likelihood ratio is equal to or larger than a threshold and using the column element likelihood ratio as it is for the posterior likelihood ratio when an absolute value of the column element likelihood ratio is equal to or larger than the threshold; and shrinking absolute values of at least some of posterior likelihood ratios and resetting all prior likelihood ratios to "0" if the decoding does not succeed even after a predetermined first cycle count of the iterative processing is performed or if the number of syndrome errors becomes smaller than a predetermined first syndrome error count.

8. The decoding method according to claim 7, wherein
when the absolute value of the posterior likelihood ratio is smaller than the threshold, the column element likelihood ratio is calculated by subtracting a row element likelihood ratio from the posterior likelihood ratio and when the absolute value of the column element likelihood ratio is smaller than the threshold, the posterior likelihood ratio is calculated by adding the row element likelihood ratio to the column element likelihood ratio.

9. The decoding method according to claim 8, wherein
the Modified-Min-Sum algorithm is used.

10. The decoding method according to claim 9, wherein the absolute values of the at least some of the posterior likelihood ratios are shrunk to 5% to 50% of the threshold.

11. The decoding method according to claim 9, wherein a first Min-Sum coefficient is used until a predetermined second cycle count of iterative processing is reached, and a second Min-Sum coefficient larger than the first Min-Sum coefficient is used when the second cycle count of iterative processing is exceeded.

12. The decoding method according to claim 11, wherein the first Min-Sum coefficient is 50% to 90% of the second Min-Sum coefficient.

* * * * *